(12) United States Patent
Bachmann et al.

(10) Patent No.: US 8,925,534 B2
(45) Date of Patent: Jan. 6, 2015

(54) INTERNAL COMBUSTION ENGINE HAVING A COMBUSTION CHAMBER SURFACE COATING OR SURFACE COATING WHICH IS CLOSE TO THE COMBUSTION CHAMBER AND METHOD FOR PRODUCING THE COATING

(75) Inventors: Mischa Bachmann, Wolfsburg (DE); Stefan Langenfeld, Calberlah (DE); Volker Zöllmer, Bremen (DE); Silvia Calvo Zueco, Esslingen am Neckar (DE); Torben Seemann, Bremen (DE); Thomas Jung, Sickte (DE)

(73) Assignee: Eberspächer Exhaust Technology GmbH & Co. KG, Neuenkirchen (DE)

( * ) Notice: Subject to any disclaimer, the term of this patent is extended or adjusted under 35 U.S.C. 154(b) by 504 days.

(21) Appl. No.: 13/255,910

(22) PCT Filed: Mar. 3, 2010

(86) PCT No.: PCT/EP2010/052671
§ 371 (c)(1),
(2), (4) Date: Nov. 25, 2011

(87) PCT Pub. No.: WO2010/102930
PCT Pub. Date: Sep. 16, 2010

(65) Prior Publication Data
US 2012/0085328 A1    Apr. 12, 2012

(30) Foreign Application Priority Data

Mar. 11, 2009 (DE) .......... 10 2009 001 500
Apr. 3, 2009 (DE) .......... 10 2009 002 183

(51) Int. Cl.
| | |
|---|---|
| F02B 75/08 | (2006.01) |
| C23C 14/06 | (2006.01) |
| B82Y 30/00 | (2011.01) |
| C23C 14/08 | (2006.01) |
| C23C 14/16 | (2006.01) |
| C23C 30/00 | (2006.01) |
| F02B 77/02 | (2006.01) |

(52) U.S. Cl.
CPC .............. *C23C 14/0688* (2013.01); *B82Y 30/00* (2013.01); *C23C 14/081* (2013.01); *C23C 14/165* (2013.01); *C23C 30/00* (2013.01); *F02B 77/02* (2013.01)
USPC ........................................................ 123/668

(58) Field of Classification Search
CPC .. F02B 77/02; F02B 19/165; F02B 2019/006; F02B 51/02; F02M 27/02; F02M 25/074; F02M 21/0296; F02M 2200/9038
USPC .................................. 123/270, 272, 670, 668
See application file for complete search history.

(56) References Cited

U.S. PATENT DOCUMENTS

| | | | | |
|---|---|---|---|---|
| 4,530,340 | A | * | 7/1985 | Totman .......................... 123/669 |
| 5,662,078 | A | * | 9/1997 | Adegawa ..................... 123/188.3 |

(Continued)

FOREIGN PATENT DOCUMENTS

| | | |
|---|---|---|
| DE | 3000497 | 8/1980 |
| DE | 10108834 | 9/2002 |

(Continued)

OTHER PUBLICATIONS

Hultqvist et al., The application of Ceramic and Catalytic Coatings to Reduce the Unburned Hydrocarbon Emissions from a Homogeneous Charge Compression Ignition Engine, SAE Technical Series 2000-01-1833 (2000), 1-11.

(Continued)

*Primary Examiner* — Hung Q Nguyen
(74) *Attorney, Agent, or Firm* — VLP Law Group LLP; Kent H. Cheng

(57) ABSTRACT

An internal combustion engine is presented having at least one combustion chamber, wherein a surface of at least one component of the combustion chamber and/or of an internal-combustion-engine component which is close to the combustion chamber and carries the exhaust gas stream is at least partially coated with a catalytic coating. The surface will come into contact with an air-fuel mixture or with an exhaust gas stream.

13 Claims, 7 Drawing Sheets

(56) References Cited

U.S. PATENT DOCUMENTS

| | | | | |
|---|---|---|---|---|
| 6,655,369 | B2* | 12/2003 | Gillston et al. | 123/670 |
| 6,932,066 | B1* | 8/2005 | Lin | 123/668 |
| 7,955,570 | B2* | 6/2011 | Insley et al. | 422/222 |
| 2011/0056123 | A1* | 3/2011 | Difrancesco et al. | 44/410 |

FOREIGN PATENT DOCUMENTS

| | | |
|---|---|---|
| DE | 10117513 | 10/2002 |
| DE | 10130673 | 1/2003 |
| DE | 10148129 | 4/2003 |
| DE | 10219643 | 11/2003 |
| DE | 202004015797 | 1/2005 |
| DE | 102005033118 | 1/2007 |
| DE | 69933434 | 8/2007 |
| DE | 102006038585 | 2/2008 |
| EP | 1878879 | 7/2006 |
| JP | 58-144624 | 8/1983 |
| WO | WO97/40266 | 10/1997 |
| WO | WO98/49365 | 11/1998 |
| WO | WO03/002859 | 1/2003 |
| WO | WO2007/006784 | 1/2007 |

OTHER PUBLICATIONS

International Search Report dated Jul. 30, 2010.

* cited by examiner

INTERNAL COMBUSTION ENGINE HAVING A COMBUSTION CHAMBER SURFACE COATING OR SURFACE COATING WHICH IS CLOSE TO THE COMBUSTION CHAMBER AND METHOD FOR PRODUCING THE COATING

PRIORITY CLAIM

This is a U.S. national stage of application No. PCT/EP10/052671, filed on Mar. 3, 2010. Priority is claimed on the following applications: German Application No.: 10 2009 001 500.0 Filed on Mar. 11, 2009 and German Application No.: 10 2009 002 183.3 Filed on Apr. 3, 2009, the contents of which are incorporated here by reference.

BACKGROUND OF THE INVENTION

The invention relates to an internal combustion engine having at least one combustion chamber, in which engine a surface of at least one component of the combustion chamber and/or of an internal-combustion-engine component which is close to the combustion chamber and carries the exhaust gas stream is at least partially coated with a catalytic coating, said surface coming into contact with an air-fuel mixture to be burned or with an exhaust gas stream. The invention further relates to PVD methods for producing such a coating.

The coating of various components in the combustion chamber of internal combustion engines with a plurality of coating materials having different properties is known from the state of the art.

For example, DE 101 30 673 A (EP 1 404 955 B) describes a catalytic coating of surfaces of the combustion chamber of internal combustion engines which comprises two oxidic components, namely a ternary vanadium oxide (in particular $V_2O_{5-x}N_x$ or $V_2O_{5-x}C_x$) as a "basic catalyst" and a further metal oxide which is selected from oxides of cerium, lanthanum, rare earths and transition metals. The catalytic coating is to support the oxidation of coke residues of the combustion process and can be produced by means of various methods, such as plasma-enhanced and ion-enhanced vacuum treatment, in particular arc evaporation, chemical impregnation by the deposition of a metallic salt solution onto the basic catalyst layer and subsequent oxidation or by a sol-gel process. Details for performing the individual methods are not disclosed.

Coatings for piston heads which are to reduce fuel deposits and thus to improve the carburetion in the combustion chamber are known from DE 101 08 834 A. For this purpose, the coating is designed as a chemically inert and thus low-reactivity coating, as a coating with few fissures and/or anti-adhesive coating or as a coating with a low coefficient of friction. The materials used are TiN, TiAlN, $ZrO_2$, Cr—CN, TiZr—CNOH, TiAl—CNOH, AlON, SiCH or Ni. PVD methods (physical vapor deposition) are generally mentioned as coating methods. The coatings exclusively aim at a modification of the physical property of the piston surface and have no chemically catalytic function.

DE 101 17 513 A (WO 02/081874 A) describes coatings on the groove and/or the valve bottom of intake valves, in particular of direct-injection spark-ignition engines, which are to prevent or reduce the coking of the intake valve. Heat-insulating $ZrO_2$ coatings, microporous and/or anti-adhesive Cr—CN coatings, chemically inert TiZr—CHNO or TiAl—CHNO coatings and catalytic vanadium nitride (VN) or platinum coatings are disclosed.

Hultqvist et al. (A. Hultqvist, M. Christensen & B. Johanson "The Application of Ceramic and Catalytic Coatings to Reduce the Unburned Hydrocarbon Emissions from a Homogeneous Charge Compression Ignition Engine", SAE Technical Series 2000-01-1833 (2000), 1-11) investigated the effects which thermal barrier layers ($Al_2O_3$) and catalytic coatings (Pt-doped $ZrO_2$) of different layer thicknesses in the combustion chamber of an engine operated according to the HCCl method have on emissions. All coatings effected a reduction of CO emissions, and the catalytic $ZrO_2$/Pt coatings surprisingly had a negative effect on HC emissions. In all, relatively thin thermal $Al_2O_3$ barrier layers produced the best emission results. The coatings were deposited according to the plasma method, i.e., according to a method belonging to the group of CVD methods (chemical vapor deposition).

DE 101 48 129 A describes catalytic coatings of combustion chamber surfaces of diesel engines which are to reduce the activation energy for fuel ignition and/or fuel combustion in order to effect a reliable auto-ignition even at low temperatures and/or pressures. The coatings contain a carrier layer made of $SiO_2$ or soot-shaped carbon, on which carrier layer a catalytic component is deposited which is selected from metals of the subgroups, lanthanides or actinides and/or the oxides and alloys thereof. The catalytic component is preferably present in the form of particles, in particular nanoparticles. The coating can be deposited according to the PVD (physical vapor deposition) or CVD (chemical vapor deposition) methods or by means of wet-chemical impregnation and subsequent thermal baking.

EP 1 878 879 A discloses a turbocharger whose stream-carrying compressor part is provided with a catalytic coating which is to decompose oily contaminants from so-called blow-by gases and thus to counteract the settling and coking thereof. The catalytic coating produced by means of thermal spraying comprises at least one transition metal oxide or mixtures thereof, wherein particularly oxides of the alloys TiZrNi, AlFeCrCo and/or AlFeCuCr and optionally a component like aluminum oxide are used.

DE 10 2005 033 118 B4 describes an internal combustion engine with an aluminum cylinder and/or aluminum piston whose side facing the combustion chamber is converted by anodizing into aluminum oxide having a hexagonal lattice structure. The hexagonal lattice forms a tubular system which includes catalytic noble metal nanoparticles added prior to anodizing. The catalyst particles have a catalytic conversion function, i.e., they serve to convert exhaust gas contaminants.

A method for the coating of catalyst substrates with a catalytically active substance is known from DE 102 19 643 A, wherein a porous carrier structure is deposited in a first step and the catalytic substance is deposited by means of plasma treatment making use of the hollow-cathode effect in a second step, wherein the process parameters are selected such that nanogranular particles having diameters of between 1 and 100 nm are obtained.

Nowadays, catalytically active surfaces, in particular of catalytic converters, are usually produced by depositing a coating on the basis of an aqueous suspension of salts of the catalytic metals (so-called washcoat) onto a carrier substrate. The metallic salts used are converted into their catalytically active form (the elemental metal or a metal oxide) in a high-temperature step (calcination). In this step, the necessary mechanical stability of the coating is also achieved. Aside from the desired oxidation and structure formation, said calcination also includes sintering processes, i.e., agglomeration of catalytic material, whereby nanostructures which are at first present are destroyed partially or even completely. Catalytic activity is reduced because the destruction of the nanostructures results in a reduced specific surface area of the catalytic coating. Particularly with coated combustion chamber surfaces or surfaces which are close to the combustion chamber, the high operating temperatures also result in sintering effects in the course of time, whereby microstructures or nanostructures which are possibly present are destroyed.

SUMMARY OF THE INVENTION

The object of the present invention is to provide a catalytic coating which is suitable for the combustion chamber of internal combustion engines or for component surfaces which are close to the combustion chamber, said catalytic coating exhibiting high catalytic activity and no or only little susceptibility to sintering effects. A further object is to provide at least one method which is suitable for producing such a coating.

These objects are achieved by an internal combustion engine and by the methods with the features of the independent claims. Further preferred realizations of the invention can be inferred from the remaining features mentioned in the subclaims.

According to its first aspect, the invention relates to an internal combustion engine having at least one combustion chamber, usually having a plurality of combustion chambers. A surface of at least one component of the combustion chamber and/or of an internal-combustion-engine component which is close to the combustion chamber and carries the exhaust gas stream is at least partially coated with a catalytic coating, said surface coming into contact with an air-fuel mixture or with an exhaust gas stream and said internal-combustion-engine component being in thermal contact with the combustion chamber. According to the invention, the catalytic coating has a nanostructure composed of oblong structural elements. Said structural elements each have a first end and a second end, said first ends adhering to the coated surface and said second ends ending in the combustion chamber or in the space which carries the exhaust gas stream and is close to the combustion chamber.

Within the scope of the present invention, the term "oblong structural element" refers to a component of the structure of the coating. The longitudinal extension of said component is several times the dimension of the diameter of its cross-sectional area which is arranged orthogonal to its longitudinal extension so that the structural elements are essentially two-dimensional fiber-like or column-like elements, wherein only one of their two ends is connected to the coated surface, whereas the second end freely projects into the space which carries the mixture or the exhaust gas. Furthermore, the term "close to the combustion chamber" refers to an internal-combustion-engine component the inlet or outlet of which is connected to and in thermal contact with the combustion chamber.

On the one hand, a large specific surface area coming into contact with the air-fuel mixture or with the exhaust gas stream can be achieved by means of the inventive specific nanostructure of the catalytic coating. In this way, a high catalytic activity and high conversion rates can be ensured in spite of the naturally extremely short contact times occurring in the engine. On the other hand, the structure of the coating composed of oblong structural elements ensures that the structural elements are essentially not or only minimally materially connected to each other, i.e., that they touch each other at most. In this way, the border existing between two structural elements forms a natural obstacle to the fusion of the two structural elements. In this way, sintering of the coating, in particular of a catalytically active metal, can be counteracted even at the high temperatures in the combustion chamber. Therefore, the large surface area of the coating caused by the described nanostructure is maintained throughout the lifetime of the internal combustion engine. It also turned out that the inventive coating exhibits high mechanical stability and adheres to the coated substrate (e.g., steel or aluminum) very well even at high temperatures so that said coating is highly suitable for use in combustion chambers.

In a preferred realization of the invention, the catalytic coating has a so-called columnar structure composed of column-like structural elements. Depending on the selected manufacturing method, the structural elements may also have a fiber-like structure.

The inventive catalytic coating has a nanostructure, which means in the present invention that the structural elements have a maximum dimension of 5000 nm in a top view of the coating essentially orthogonal to the coated surface. In a preferred embodiment, a mean diameter of the cross-sectional plane of the structural elements which is arranged essentially parallel to the coated surface and orthogonal to the longitudinal extension of the structural elements is 1000 nm at most and preferably 1 to 500 nm. In a preferred embodiment, the cross-sectional plane has a mean diameter in the range from 5 to 100 nm, particularly preferably in the range from 10 to 50 nm. On the other hand, the layer thickness of the coating which is essentially defined by the longitudinal extension of the structural elements of the coating is usually several times the transverse diameter of the structural elements. In particular, layer thicknesses or lengths of the structural elements in the range from 0.1 to 50 µm are preferred, preferably in the range from 0.5 to 20 µm. These layer thicknesses which are relatively small in comparison with usual washcoats have various advantages. Slow chemical reactions require thicker layers of up to several hundreds of micrometers, whereas the catalysis of fast combustion reactions requires only few micrometers or less. Thick layers require an unnecessarily high consumption of expensive catalyst elements, in particular of platinum group metals (PGM). Furthermore, thin layers usually result in improved adhesion in the thermocyclic operation of the internal combustion engine. Finally, the flow resistance of thin layers is lower than that of thicker layers.

Preferably, the structural elements are not materially (cross-)connected to each other, whereby sintering processes can be optimally inhibited, wherein the structural elements may also be spaced out.

Theoretically, any density of coating material can be achieved by means of the manufacturing methods described below. Preferably, the volume ratio of the coating is in the range from 5 to 95 percent by volume, particularly in the range from 30 to 80 percent by volume, and particularly preferably in the range from 50 to 70 percent by volume. When the density is too high, the active surface area of the coating is reduced so that its activity is reduced. On the other hand, the mechanical stability of the coating is reduced when the densities are too low.

The coating material is selected such that the desired catalytic effect is achieved on the one hand and a sufficiently large specific surface area of the material and a sufficient mechanical stability and adhesion are achieved on the other hand. Concerning the first aspect, the catalytic material of the coating is selected such that an oxidation of unburned or partially burned hydrocarbons of the fuel as well as of carbon-containing combustion residues is catalytically supported, whereby carbon-containing deposits on components of the combustion chamber and/or on components which are close to the engine can be avoided and the emission of pollutants (particles, HC) can be reduced. At the same time, the kinetics of combustion prereactions close to the wall of the combustion chamber is influenced. Thus, the formation of combustion preproducts, combustion products and pollutant emissions can be favorably influenced. Moreover, wear and malfunctions which may be caused on various components by soot deposits are avoided. The desired oxidation of carbon-containing deposits and of unburned hydrocarbons is achieved by means of at least one catalytically active, elemental and/or oxidic transition metal and/or noble metal in the coating, wherein the at least one noble metal is preferably selected from the group consisting of Pt, Pd and Rh (PGM), Ni, Cu, Ag and Au, wherein said noble metals may be present in the form of elemental metals (oxidation number 0), oxides or mixtures. Furthermore, the at least one transition metal is preferably selected from the group consisting of Co, Fe, Mo, Nb, V, W, Cu and Cr, wherein said metals are preferably present in the form of oxides in the coating.

According to a preferred realization of the invention, the coating contains a combination of the at least one catalytically active transition metal and/or noble metal and at least one carrier metal oxide. On the one hand, the carrier metal oxide functions as a carrier and/or as a matrix for the catalytically active transition metal and/or noble metal so that said metal is fixed on and/or in the carrier metal oxide. On the other hand, the at least one carrier metal oxide may have a surface-increasing function. Moreover, a suitable carrier metal oxide can support the catalyzed oxidation reaction because it is able to reversibly store oxygen and because of the ionic conduction of oxygen. The at least one carrier metal oxide is preferably selected from oxides of the metals of groups IIa, IVa, IIIb, IVb and Vb of the periodic table of elements as well as of the rare-earth elements. Particularly preferably, the carrier metal oxide comprises $CeO_2$, $ZrO_2$, $TiO_2$, $Al_2O_3$ and/or $SiO_2$.

The weight ratio of the carrier metal oxide to the catalytically active transition metal/s and/or noble metal/s may vary widely. As a tendency, there is more carrier metal oxide than catalytically active metal so that the latter can be considered to be the dopant for the carrier metal oxide. In particular, the weight ratio of the carrier metal oxide/s to the transition metal/s and/or noble metal/s is in the range from 1000:1 to 1:1 or in the range from 300:1 to 10:1 and typically in the range from 30:1 to 10:1.

Various embodiments are possible as far as the ways of distribution of the catalytically active metal in the at least one carrier metal oxide are concerned. In a first embodiment, the at least one transition metal and/or noble metal can be essentially homogeneously distributed in the at least one carrier metal oxide. This embodiment results in a particularly high mechanical and thermal stability of the coating so that it can be advantageous for components which are subjected to particularly high mechanical or thermal stress, i.e., particularly in the combustion chamber, wherein it is possible that the at least one catalytic metal can develop a concentration gradient within the carrier metal oxide, in particular with a concentration which increases towards the combustion chamber or space which carries the mixture or the exhaust gas, so that the concentration of the catalytic metal is highest in the combustion chamber or in the volume which is close to the combustion chamber. In this connection, the course of said concentration gradient can be continuous or gradual. In an alternative embodiment, the coating is composed of individual layers with at least one layer of the transition metal and/or noble metal alternating with carrier metal oxide layers or being arranged adjacent to such a carrier metal oxide layer.

The inventive coating can be advantageously provided on a plurality of internal-combustion-engine surfaces which come into contact with the air-fuel mixture or with the exhaust gas stream, in particular on a piston head, an inner surface of a cylinder, an inner surface of a cylinder head, a valve bottom and/or a groove of intake and/or outlet valves, a fuel injection nozzle, an inner surface of an exhaust manifold and/or exhaust pipe, an EGR valve, an EGR cooler, and/or an exhaust-stream-carrying surface of a turbocharger, in particular of the compressor thereof.

According to a further aspect, the present invention relates to a method for producing a coating according to the present invention, wherein the coating is preferably produced according to the PVD magnetron sputtering method or the PVD gas flow sputtering method. The advantage of said methods consists in the fact that the inventive nanostructure of the catalytic coating consisting of oblong structural elements, in particular the columnar nanostructure, can be easily produced by means of epitaxial growth of the deposited coating material if suitable process parameters are selected. Furthermore, little time and little energy are consumed when using said methods. Moreover, said methods cause only low thermal stress for the component to be coated. Custom-made thin nanoporous catalyst layers having the above-described advantages can be advantageously produced by means of these two sputtering methods. The originally produced nanostructure, in particular the columnar structure, is maintained because no high-temperature process is required during or after the deposition of the coating material.

The two sputtering methods mentioned above belong to the group of PVD methods (PVD=physical vapor deposition). The term "physical vapor deposition" is the generic term for various vacuum-based coating methods in which the layer is produced by the condensation of a material vapor of the coating material on the substrate to be coated. On principle, the solid coating material (target) is evaporated in an evacuated chamber and deposited on the substrate. Depending on the concrete method, this is done thermally (thermal evaporation), by bombardment with laser beams (laser beam evaporation), with electrons (electron beam evaporation), with ions (cathode sputtering or sputter deposition), or by means of other methods, wherein the evaporated material can be guided towards the substrate by means of electric fields or moves ballistically if no electric fields are present. In the sputtering process (also called cathode sputtering or sputter deposition) relevant herein, the target to be sputtered is connected as a cathode and bombarded with high-energy ions (mostly noble gas ions) in order to extract atomic material from the target and deposit it on the substrate which is arranged close to the target. In the magnetron sputtering process, a magnet is arranged behind the target so that the generated additional magnetic field and the electric field superpose. The magnetron sputtering method and the gas flow sputtering (GFS) method particularly easily enable the coating material to be deposited according to the principle of epitaxial crystal growth by selecting suitable process parameters (such as pressure, voltage, magnetic field strength, etc.), whereby the inventive structures, in particular the columnar structures, can be easily produced.

The above-described structures in which the at least one catalytically active transition metal and/or noble metal is homogeneously distributed in the at least one carrier metal oxide can be produced by means of parallel co-sputtering. In said co-sputtering process, either all materials are present in one mixed or alloy target or several individual targets are eroded simultaneously. If a multi-layer structure is desired, said structure can be easily produced by means of the above-mentioned sputtering processes in which the respective targets are successively eroded and deposited.

BRIEF DESCRIPTION OF THE DRAWINGS

In the following, the invention will be explained in greater detail by way of exemplary embodiments on the basis of the associated drawings in which FIG. 1 schematically shows a cylinder of an internal combustion engine as well as components which are close to the combustion chamber.

DETAILED DESCRIPTION OF THE PRESENTLY PREFERRED EMBODIMENTS

Figure 1:
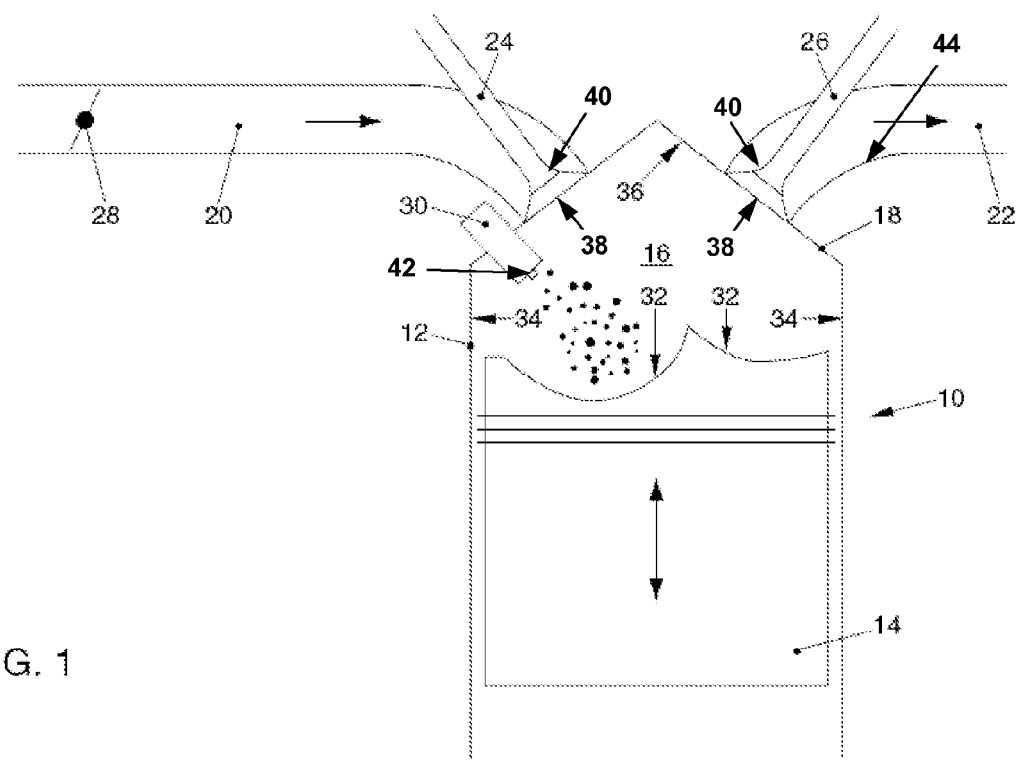

FIG. 1 schematically shows a sectional view of combustion-chamber-relevant components of an auto-ignition internal combustion engine which is realized, according to the preferred embodiment of the invention, as an (auto-ignition) diesel engine. FIG. 1 exemplarily shows only one cylinder 12 of the internal combustion engine (general reference numeral 10). Of course, the internal combustion engine 10 may have several cylinders 12 in different arrangements. A piston 14 whose longitudinal movement is transformed into a rotational movement of a crankshaft (not shown) is axially movably arranged in the cylinder 12. In the interior of the cylinder 12, a combustion chamber 16 is enclosed by the piston 14 on the one hand and the cylinder 12 on the other hand. An intake port 20 for supplying air to the combustion chamber 16 and an outlet port 22 for removing the exhaust gases lead into a cylinder head 18 of the cylinder 12. The intake port 20 and the outlet port 22 are opened and closed by means of an intake valve 24 and an outlet valve 26, respectively. Usually, said valves are asynchronously controlled by means of a camshaft (not shown). Of course, several intake and outlet ports 20, 22 (e.g., two each) each equipped with respective valves 24, 26 may be provided per cylinder. A stream of air mass to be supplied to the combustion chamber 16 is closed-loop controlled in a load-controlled manner by a controllable throttle valve 28 arranged in the intake port 20. Furthermore, a high-pressure injection valve 30 for the injection of fuel, in particular of diesel fuel, into the combustion chamber 16 is arranged in the cylinder head 18.

As usual with diesel engines, the auto-ignition of the air-fuel mixture produced in the combustion chamber 16 is a result of the compression by the upwardly moving piston 14 in the compression stroke with valves 24, 26 being closed, wherein the products of diesel fuel combustion are carbon dioxide ($CO_2$) as a main product and certain amounts of carbon monoxide (CO) and unburned or partially burned hydrocarbons (HC), wherein the latter are known to cause the formation of deposits on various components of the combustion chamber or of exhaust-carrying components. Catalytic coatings are deposited on various surfaces in order to counteract the formation of said carbon-containing or soot-containing deposits. In the combustion chamber 16, this particularly relates to the piston head 32, the inner surface 34 of the cylinder and/or the inner surface 36 of the cylinder head.

Furthermore, the valve bottoms 38 of the intake valve 24 and/or outlet valve 26 and/or the valve grooves 40 may have catalytic coatings. A nozzle 42 of the injection valve 30 may also be provided with an inventive catalytic coating in order to avoid malfunctions caused by deposits. The inner surface 44 of the exhaust pipe (exhaust manifold) 22 may also have a catalytic coating for supporting the catalytic afterburning of unburned hydrocarbons and for avoiding the formation of deposits. FIG. 1 does not show any exhaust-gas-recirculation (EGR) components which direct exhaust gases from the outlet port back into the intake pipe 20. Within the scope of the present invention, an associated EGR valve and/or EGR cooler may also be provided with the inventive catalytic coating. Furthermore, an inner surface of an exhaust-driven compressor of a turbocharger (not shown) may have the catalytic coating.

Aside from the above-mentioned catalysis of the oxidation of unburned or partially burned hydrocarbons and soot, the catalytic coating may also exhibit heat-insulating and/or anti-adhesive properties in order to favorably influence the combustion process or counteract the formation of deposits.

Figure 2:
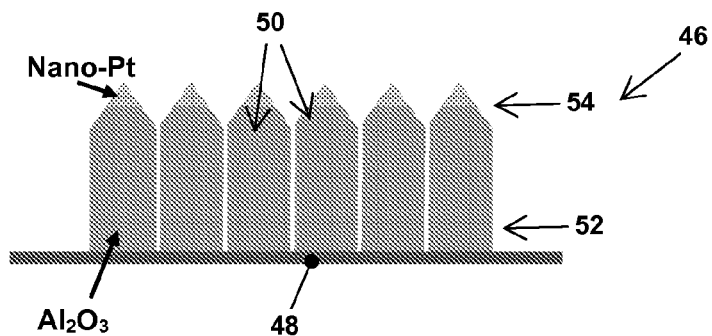
FIGS. 2 and 3 show model structures of the catalytic coating according to various embodiments of the invention.

FIG. 2 is a greatly simplified schematic representation of an advantageous realization of an inventive catalytic coating (general reference numeral 46) with a coated substrate (e.g., a piston head or an inner surface of a cylinder) 48, wherein the substrate may be typically made of steel or aluminum. According to the invention, the coating 46 is essentially composed of oblong structural elements 50. FIG. 2 exemplarily shows six such structural elements 50. In the example shown, the structural elements 50 are columnar elements with a first end 52 adhering to the coated surface of the substrate 48 and a second end 54 ending in the space (e.g., a combustion chamber) which comes into contact with the air-fuel mixture or with the exhaust gas stream. According to the exemplary embodiment shown, the coating 46 is a combination of a carrier metal oxide and at least one catalytically active metal or metal oxide. According to the example shown, the carrier metal oxide (here $Al_2O_3$) forms the bulk volume of the structural elements 50 of the coating and is particularly in direct contact with the coated substrate 48, whereas the catalytically active metal which particularly comprises a transition metal and/or a noble metal and/or the oxides thereof (e.g., metallic platinum (Pt) in the present realization) is essentially concentrated at the second end 54 of the structural elements 50 which faces the combustion chamber. In this way, nearly all platinum atoms are present on the exposed surface of the structural elements 50. Thus, they can optimally develop their catalytic activity in connection with the oxidation of hydrocarbons. On the one hand, the carrier oxide $Al_2O_3$ functions as a carrier for the catalytic material Pt and fixes it on the substrate 48 and also serves to create a large specific surface area. If $Al_2O_3$ is the carrier oxide, said carrier oxide also exhibits advantageous anti-sintering properties which prevent the fusion of the separate structural elements 50. FIG. 2 clearly shows that the diameter of the structural elements 50 relative to their cross-sectional area parallel to the substrate 48 is greater than the diameter of the catalytic material. For example, the maximum average diameter of the structural elements in the lower region is 500 nm, whereas the diameter of the platinum points is, e.g., 50 nm or smaller.

Figure 3:
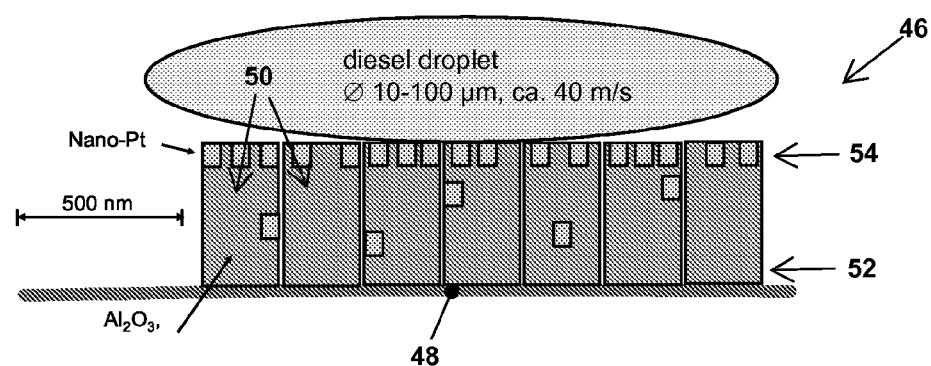

FIG. 3 shows a further model of an inventive catalytic coating 46, wherein similar elements have the same reference numerals as in FIG. 2. In contrast to the structure shown in FIG. 2, the structural elements 50 in FIG. 3 have a blunt second end 54 which faces the combustion chamber, said second end 54 being a mixed phase of the carrier oxide and the catalytic metal. This structure can be produced by co-sputtering, i.e., by sputtering a target made of pure carrier material Al₂O₃ or of pure aluminum metal in a first step and a mixed AlPt-target or two separate Al- and Pt-targets in a second step. Furthermore, FIG. 3 schematically indicates a diesel droplet which hits the coating 46 at a typical speed of about 40 m/s and has a typical diameter of 10-100 μm. FIG. 3 clearly shows that this fuel droplet mainly comes into contact with the catalytic metal Pt so that the catalytic metal advantageously catalyzes the oxidation of the fuel droplet.

On principle, the structure sizes created on the substrate 48 are defined by the dimensions of the primary particles produced in the sputtering processes which can be widely influenced by selecting suitable process parameters for the sputtering processes.

Figure 4:
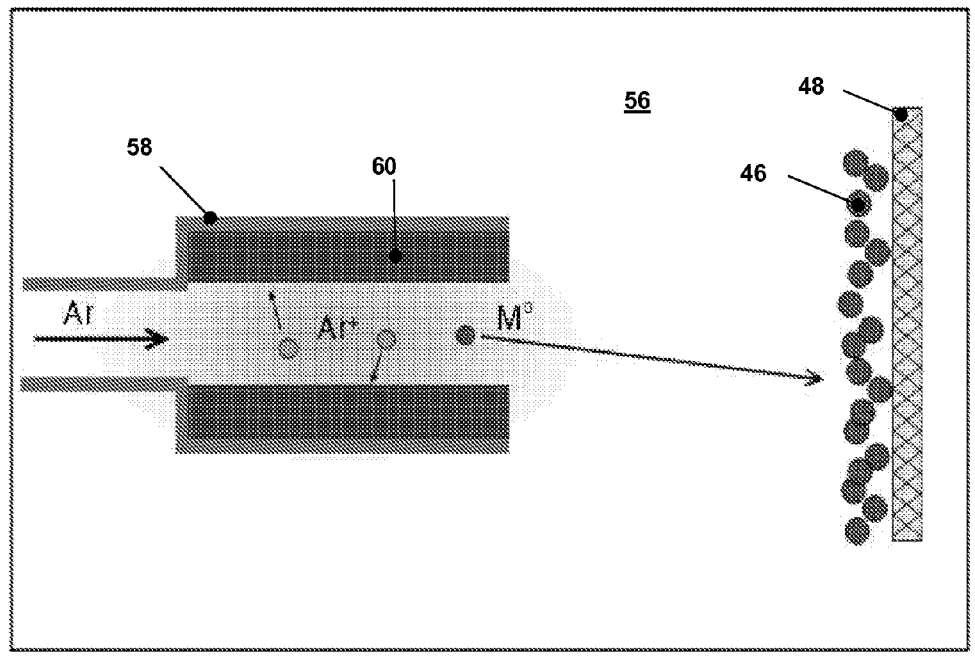
FIG. 4 shows a schematic design of a device for gas flow sputtering.

FIG. 4 is a greatly simplified representation of the basic design of a device for gas flow sputtering. Here again, the substrate to be coated has the reference numeral 48 and the coating has the reference numeral 46. A hollow cathode 58 arranged in a vacuum chamber 56 has an inner surface made of the target material 60, said inner surface usually consisting of the metal component of the coating material. A working gas, e.g., argon (Ar), is conveyed through the hollow cathode 58 and partially ionized on account of the discharge of the hollow cathode. The argon ions $Ar^+$ are accelerated towards the surface of the target 60. When they hit the surface, they eject individual atoms $M^0$ from the target material. Said atoms $M^0$ are conveyed with the argon gas stream to the substrate to be coated 48 which is also arranged in the vacuum chamber. On the substrate 48, the atoms $M^0$ of the coating material or primary particles of the atoms $M^0$ are deposited and form a coating 46 by epitaxial growth. The coating is preferably produced at a total pressure of 0.1 to 10 mbar. Typically, the distance between the hollow cathode 58 and the substrate 48 is about 20 to 400 mm. For obtaining the desired layer structure, a negative substrate bias voltage in the range from 20 to 200 V may be applied to the substrate.

Figure 5:
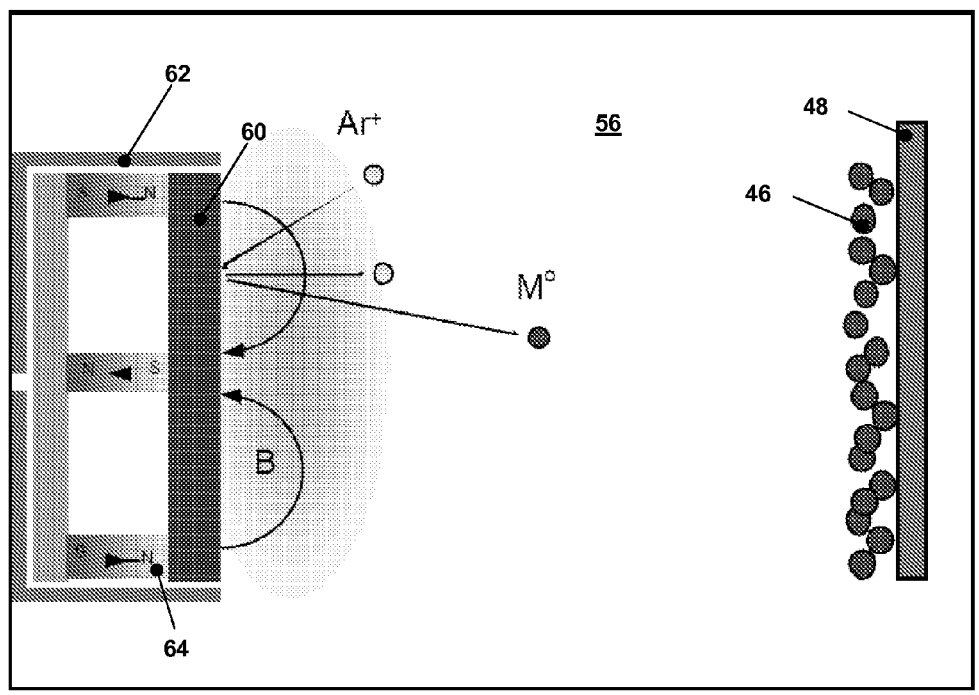
FIG. 5 shows a schematic design of a device for magnetron sputtering.
Figure 6:
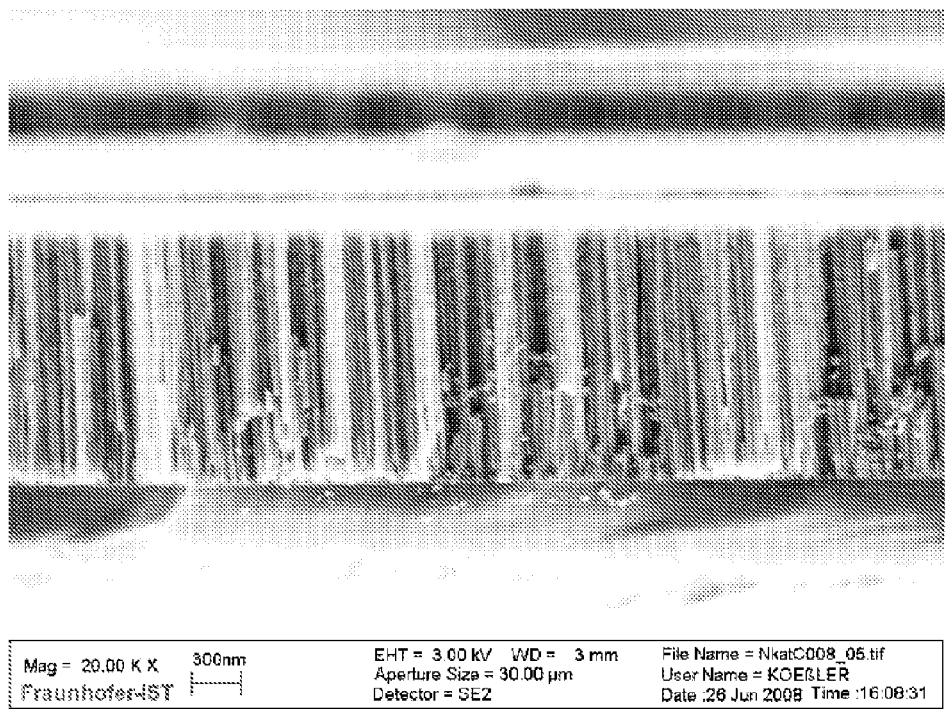
FIGS. 6 to 9 show SEM images of gas-flow-sputtered catalytic coatings according to various embodiments of the present invention.
Figure 7:
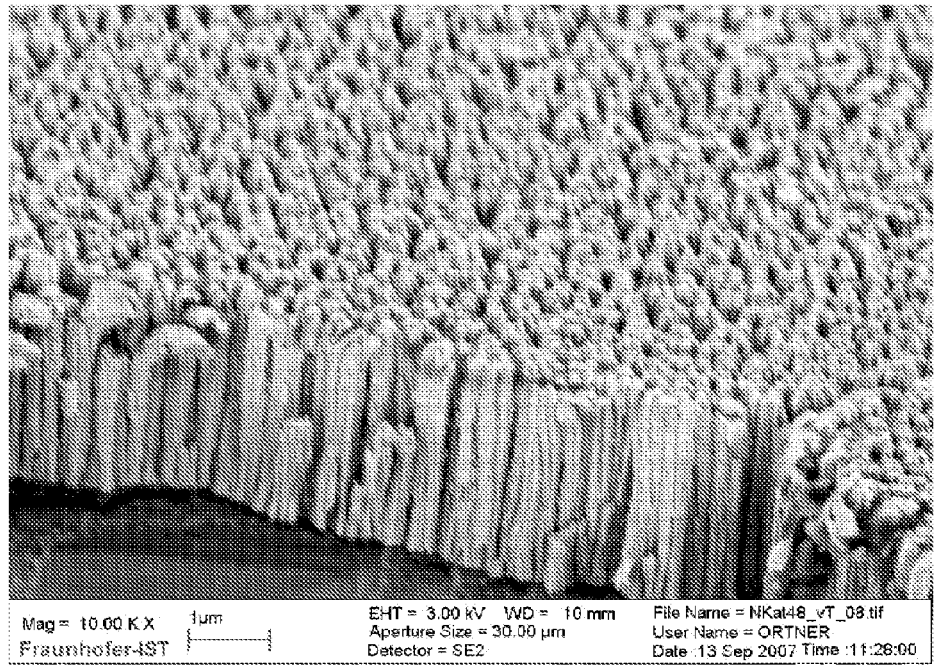
Figure 8:
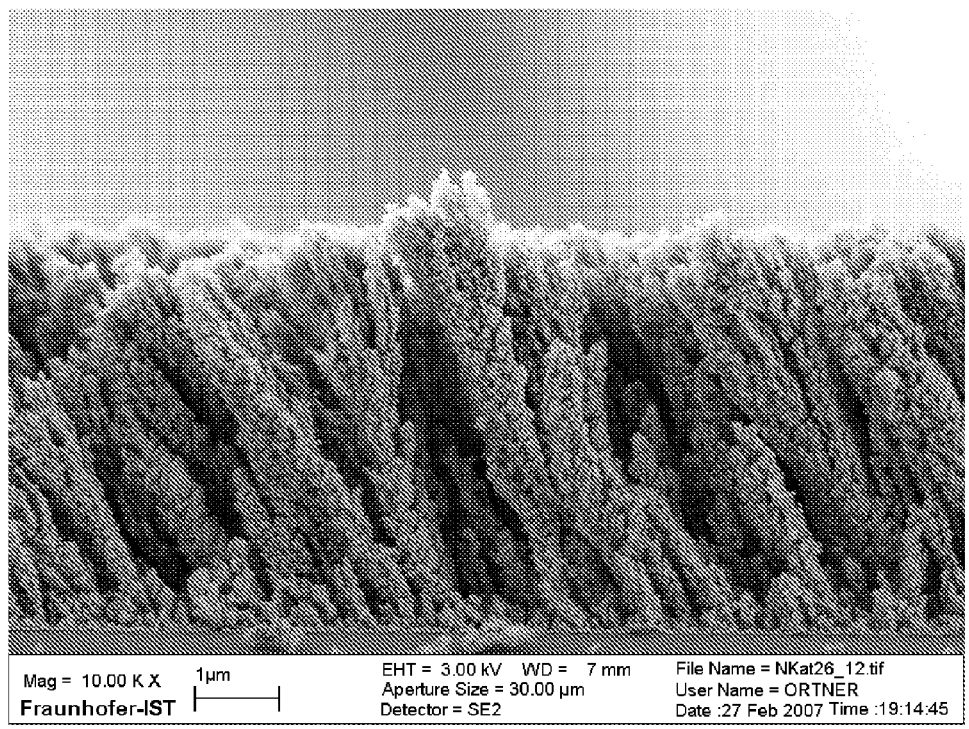
Figure 9:
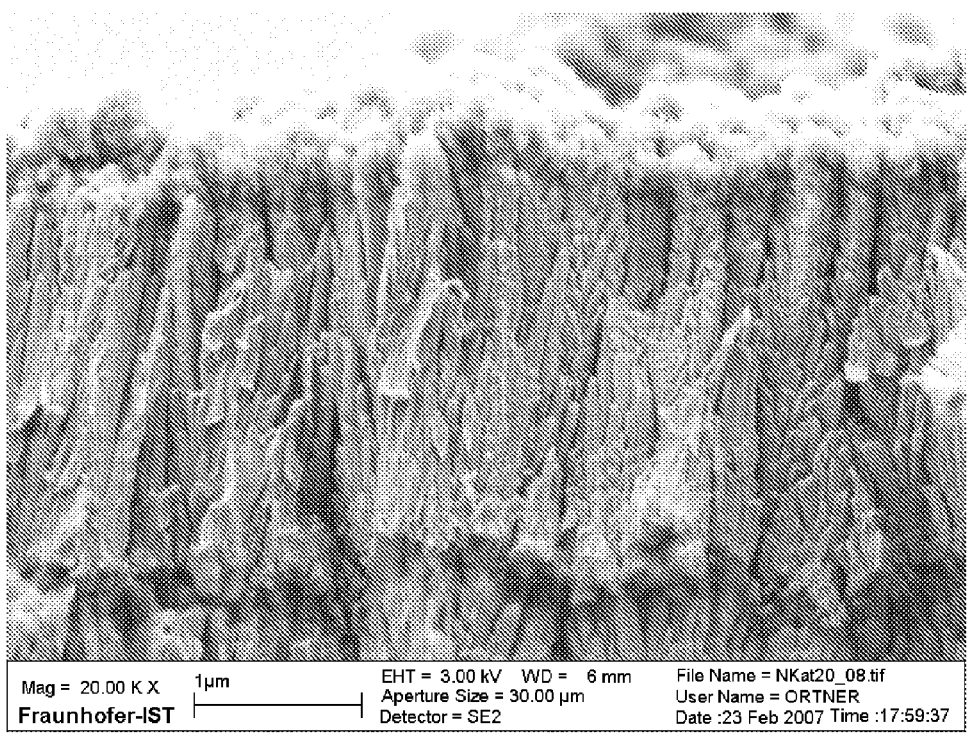

The device for magnetron sputtering schematically shown in FIG. 5 also comprises a vacuum chamber 56 in which the substrate to be coated 48 and a target 60 of the coating material which electrically contacts a cathode 62 are arranged. In addition, a magnet arrangement 64 is provided under the target 60. The magnet arrangement 64 generates a magnetic field B, wherein the magnetic field B and the electric field superpose. Here again, e.g., argon as a working gas is conveyed into the chamber 56. The gas is ionized and ejects atoms $M^0$ from the target material. The atoms $M^0$ are deposited on the substrate 48. The charge carriers are deflected by the magnetic field and spiral above the target surface, whereby the number of impacts, the ionization rate and sputtering erosion are increased.

In both methods presented above (gas flow sputtering and magnetron sputtering), the working pressure is particularly important as far as influencing the layer structure to be created is concerned. In particular, a wide range of volume ratios is possible in dependence on the selected working pressure of 0.01 to 100 mbar. Typically, pressures of 0.05 to 10 mbar, preferably of 0.1 to 1 mbar, are selected in order to achieve the preferred volume ratios of between 30 and 80%. It is also possible in both methods to apply a negative substrate bias voltage to the substrate in order to obtain the desired layer structure. For this purpose, the substrate bias voltage may be in the range from 1 to 1000 V, particularly in the range from 10 to 500 V, and preferably in the range from 20 to 200 V.

In the gas flow sputtering process as well as in the magnetron sputtering process, the coating material itself or, if it is to be oxidically deposited, the elemental metal form $M^0$ thereof may be used as the target 60. In the latter case, a reactive gas (e.g., oxygen) is added to the working gas. The reactive gas causes an oxidation of the metal $M^0$. This method is known as reactive sputtering. If, e.g., an aluminum oxide layer is to be deposited, a metallic aluminum target may be used, wherein the oxide is formed (using oxygen as a reactive gas) according to the following reaction equation: $4\,Al\,(Target\,\mathbf{60}) + 3\,O_2 \rightarrow 2\,Al_2O_3\,(Layer\,\mathbf{46})$. In the co-sputtering process for producing a metal-doped carrier oxide layer (e.g., $Pt/Al_2O_3$), a target consisting of an Al—Pt alloy may be used, wherein only the more ignoble aluminum is oxidized by the oxygen.

FIGS. 6 to 9 show scanning-electron-microscope images of inventive gas-flow-sputtered catalytic coatings. The columnar structural elements clearly shown in FIG. 6 consist of $CeO_2$ which was produced by means of reactive gas flow sputtering, i.e., with a metallic Ce-target in an oxidizing atmosphere, whereas FIGS. 7 to 9 each show coatings made of $Al_2O_3$ and platinum at the outermost ends of the fiber-like or columnar structural elements, i.e., at the free structural-element ends facing the combustion chamber, for example. The figures clearly show that a wide variety of material densities can be created by influencing the process parameters of gas flow sputtering. The coatings shown in FIGS. 7 and 8 exhibit a comparatively porous structure, whereas the coating shown in FIG. 9 exhibits a relatively high compactness.

Figure 10:
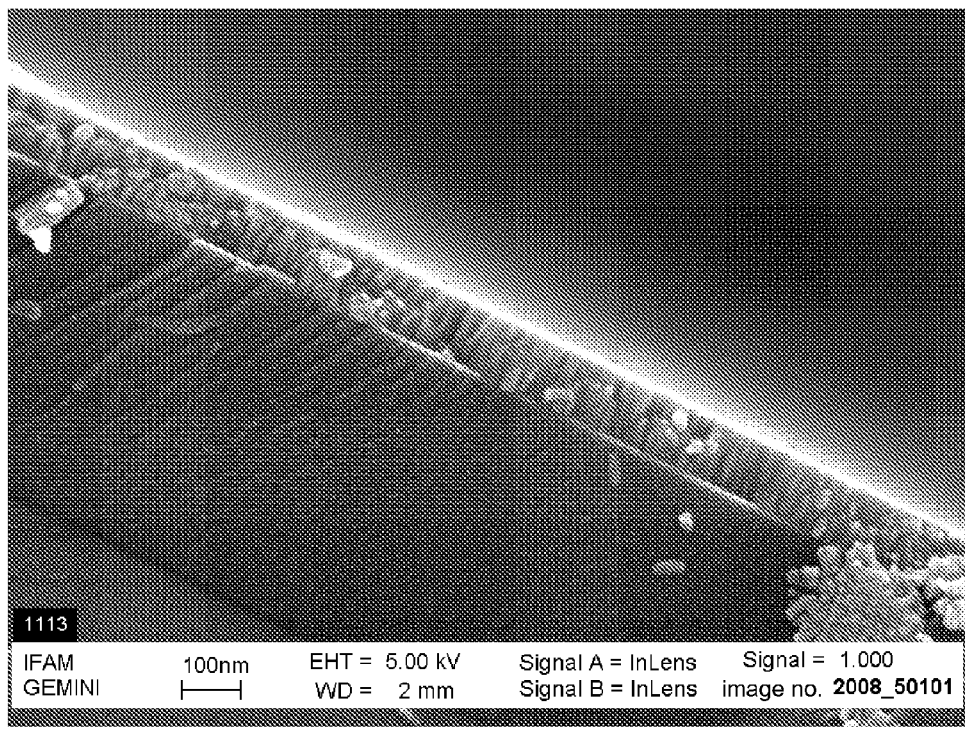
FIGS. 10 to 12 show SEM images of magnetron-sputtered catalytic coatings according to various embodiments of the present invention.
Figure 11:
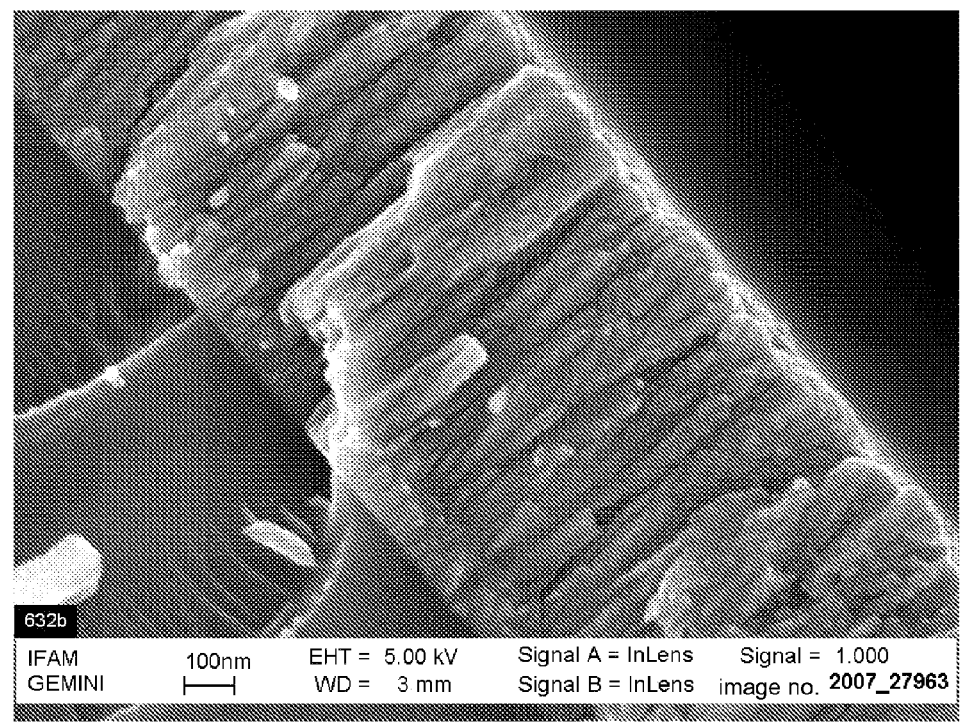
Figure 12:
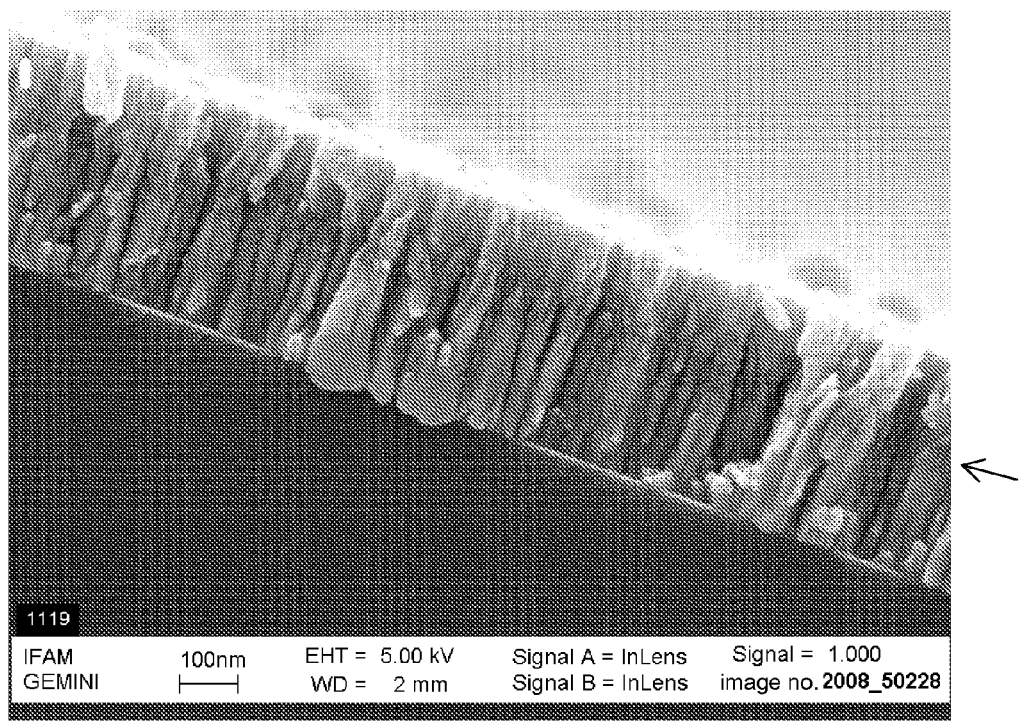

The SEM images in FIGS. 10 to 12 show magnetron-sputtered coatings made of $SiO_2$ as a carrier oxide and cobalt (Co) as a catalytic metal, wherein the coatings according to FIGS. 10 and 11 were produced by co-sputtering the catalytic metal and the carrier oxide so that the catalytic metal is homogeneously distributed in the carrier oxide ($Co:SiO_2=1:2$, size of primary particles 10-20 nm), whereas the coating according to FIG. 12 was produced by successive sputtering, i.e., by sputtering a carrier metal layer in a first step, a catalyst layer in a second step, and another carrier metal layer in a third step. The Co-catalyst layer is the dark intermediate layer which is arranged orthogonal to the columnar orientation (see arrow).

LIST OF REFERENCE NUMERALS

10 internal combustion engine
12 cylinder
14 piston
16 combustion chamber
18 cylinder head
20 intake pipe
22 exhaust pipe/exhaust manifold
24 intake valve
26 outlet valve
28 throttle valve
30 injection valve
32 piston head
34 inner surface of cylinder
36 surface of cylinder head
38 valve bottom
40 valve groove
42 nozzle
44 inner surface of exhaust manifold
46 catalytic coating
48 substrate
50 structural elements
52 first end
54 second end
56 vacuum chamber
58 hollow cathode 60 target
62 cathode
64 magnet arrangement

The invention claimed is:

1. An internal combustion engine having at least one combustion chamber, wherein a surface of at least one component of the combustion chamber and/or of an internal-combustion-engine component which is close to the combustion chamber and carries the exhaust gas stream is at least partially coated with a catalytic coating, said surface coming into contact with an air-fuel mixture or with an exhaust gas stream, wherein
the catalytic coating has a nanostructure composed of oblong structural elements, wherein first ends of the structural elements adhere to the coated surface and second ends of the structural elements project into the combustion chamber or into the space which carries the exhaust gas stream.

2. The internal combustion engine according to claim 1, wherein
the catalytic coating has a columnar nanostructure composed of column-like structural elements.

3. The internal combustion engine according to claim 1, wherein
the structural elements are not cross-connected to each other.

4. The internal combustion engine according to claim 1, wherein
a mean diameter of a cross-sectional plane of the structural elements which is arranged essentially parallel to the coated surface is 1000 nm at most.

5. The internal combustion engine according to claim 1, wherein
a volume filling of the coating is in the range from 5 to 95.

6. The internal combustion engine according to claim 1, wherein
the catalytic coating comprises at least one catalytically active, elemental and/or oxidic transition metal and/or noble metal.

7. The internal combustion engine according to claim 6, wherein
the at least one noble metal is selected from the group consisting of Pt, Pd, Rh, Ni, Cu, Ag and Au.

8. The internal combustion engine according to claim 6, wherein
the at least one transition metal is selected from the group consisting of Co, Fe, Mo, Nb, V, W, Cu and Cr.

9. The internal combustion engine according to claim 6, wherein
the coating comprises a combination of the at least one catalytically active transition metal and/or noble metal and at least one carrier metal oxide, wherein the at least one carrier metal oxide represents a carrier and/or a matrix for the at least one transition metal and/or noble metal.

10. The internal combustion engine according to claim 9, wherein the at least one carrier metal oxide is selected from oxides of the metals of groups IIa, IVa, IIIb, IVb and Vb of the periodic table of elements and of the rare-earth elements.

11. The internal combustion engine according to claim 9, wherein
a weight ratio of the at least one carrier metal oxide to the at least one catalytically active transition metal and/or noble metal is in the range from 1000:1 to 1:1.

12. The internal combustion engine according to claim 9, wherein
the at least one transition metal and/or noble metal is homogeneously distributed in the at least one carrier metal oxide or develops a concentration gradient within the at least one carrier metal oxide or is present in at least one layer of its own.

13. The internal combustion engine according to claim 9, wherein the surface which comes into contact with the air-fuel mixture or with the exhaust gas stream is selected from the group consisting of a surface of a piston head, an inner surface of a cylinder, a surface of a cylinder head, a groove and/or a valve bottom of intake and/or outlet valves, a fuel injection nozzle, an inner surface of an exhaust manifold and/or exhaust pipe, an EGR valve, an EGR cooler and/or an inner surface of a turbocharger.

* * * * *